United States Patent
Breuls et al.

(10) Patent No.: US 6,372,305 B2
(45) Date of Patent: Apr. 16, 2002

(54) PCVD APPARATUS AND A METHOD OF MANUFACTURING AN OPTICAL FIBER, A PREFORM ROD AND A JACKET TUBE AS WELL AS THE OPTICAL FIBER MANUFACTURED THEREWITH

(75) Inventors: Antonius Henricus Elisabeth Breuls, Urmond; Mattheus Jacobus Nicolaas Van Stralen, Tilburg; Andries Heero Van Bergen, Nuenen, all of (NL)

(73) Assignee: Plasma Optical Fibre B.V., Eindhoven (NL)

(*) Notice: Subject to any disclaimer, the term of this patent is extended or adjusted under 35 U.S.C. 154(b) by 0 days.

(21) Appl. No.: 09/813,347

(22) Filed: Mar. 14, 2001

Related U.S. Application Data

(62) Division of application No. 09/221,227, filed on Dec. 23, 1998, now Pat. No. 6,260,510.

(30) Foreign Application Priority Data

Dec. 31, 1997 (EP) .............................................. 97204152

(51) Int. Cl.[7] .............................. B05D 7/22; C23C 16/00
(52) U.S. Cl. ........... 427/575; 427/163.2; 118/723 MW; 118/723 ME
(58) Field of Search .............................. 427/575, 163.2, 427/238, 294; 118/723 MW, 720, 725, 723 ME; 65/425

(56) References Cited

U.S. PATENT DOCUMENTS

| | | | |
|---|---|---|---|
| 4,292,063 A | 9/1981 | Abe | 65/3.12 |
| 4,473,596 A | 9/1984 | Beerwald et al. | 427/10 |
| 4,877,938 A | 10/1989 | Rau et al. | 219/121.59 |
| 5,597,624 A | 1/1997 | Blinov et al. | 427/575 |

FOREIGN PATENT DOCUMENTS

| | | |
|---|---|---|
| EP | 0554845 A1 | 8/1993 |
| GB | 2149779 A | 6/1985 |

*Primary Examiner*—Gregory Mills
*Assistant Examiner*—P. Hassanzadeh
(74) *Attorney, Agent, or Firm*—Seed IP Law Group, PLLC

(57) ABSTRACT

The invention relates to an apparatus for performing Plasma Chemical Vapor Deposition (PCVD), whereby one or more layers of silica can be deposited on an elongated vitreous substrate, the apparatus comprising an elongated microwave guide which emerges into a resonant cavity which is substantially cylindrically symmetric about a cylindrical axis, along which axis the substrate can be positioned, in which apparatus:

- the cavity is substantially annular in form, with an inner cylindrical wall and an outer cylindrical wall;
- the inner cylindrical wall comprises a slit which extends in a full circle around the cylindrical axis;
- the guide has a longitudinal axis which is substantially perpendicular to the cylindrical axis and which does not intercept the slit.

The invention also relates to a method of manufacturing an optical fiber, a preform rod and a jacket tube using said apparatus as well as to the thus obtained optical fiber.

17 Claims, 1 Drawing Sheet

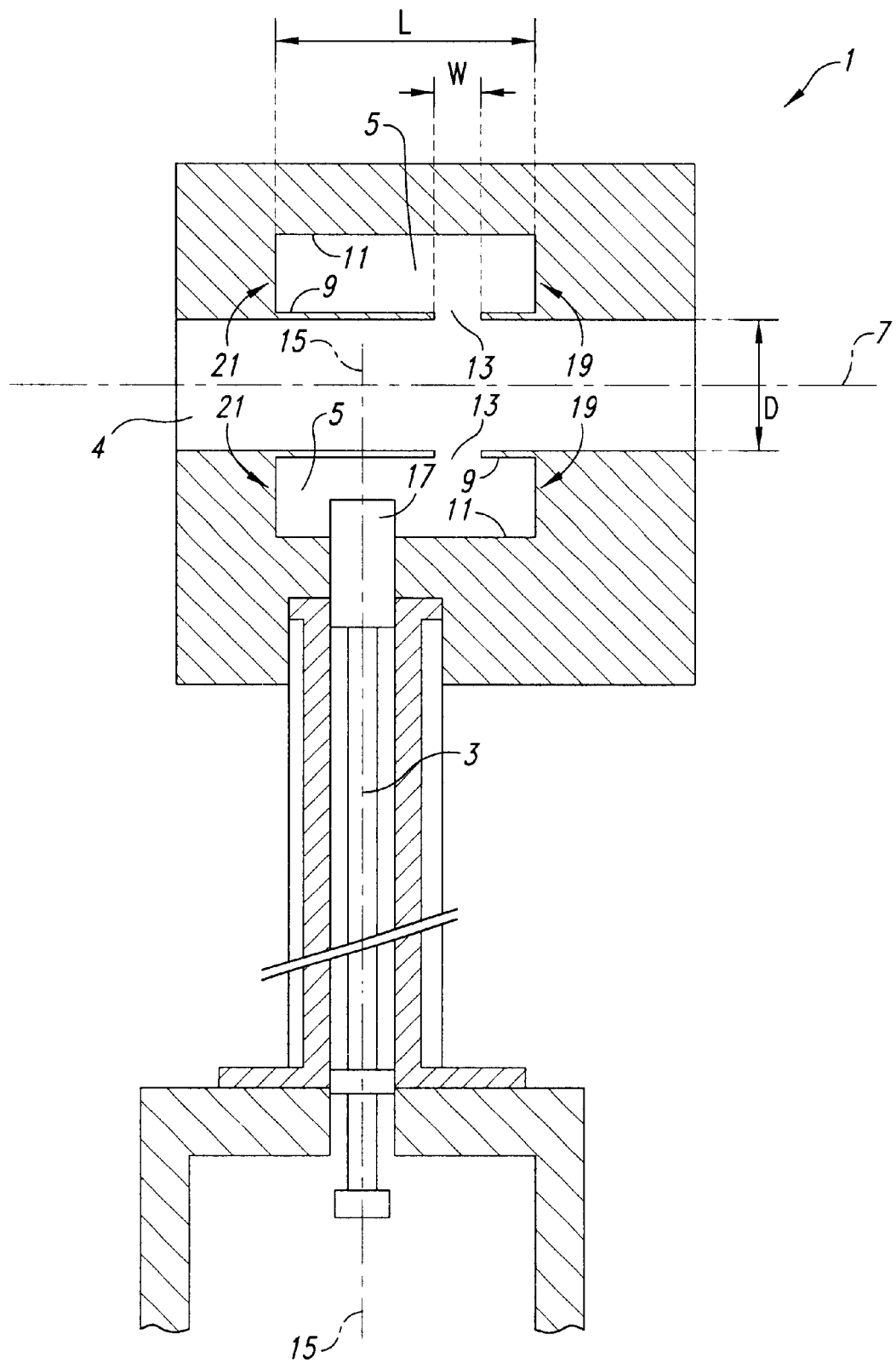

PCVD APPARATUS AND A METHOD OF MANUFACTURING AN OPTICAL FIBER, A PREFORM ROD AND A JACKET TUBE AS WELL AS THE OPTICAL FIBER MANUFACTURED THEREWITH

CROSS-REFERENCE TO RELATED APPLICATION

This application is a divisional of U.S. patent application Ser. No. 09/221,227, filed Dec. 23, 1998, and issued Jul. 17, 2001 as U.S. Pat. Ser. No. 6,260,510.

The invention relates to an apparatus for performing Plasma Chemical Vapor Deposition (PCVD), whereby one or more layers of silica can be deposited on an elongated vitreous substrate, the apparatus comprising an elongated microwave guide which emerges into a resonant cavity which is substantially cylindrically symmetric about a cylindrical axis, along which axis the substrate can be positioned.

The term "silica" should here be interpreted as referring to any substance of the form $SiO_x$, whether stoichiometric or not, and whether crystalline or amorphous.

Such an apparatus is well known in the art of optical fiber manufacture, for example, and can be used in that context to manufacture a so-called preform rod from which an optical fiber can be drawn. In one known method of manufacturing such a preform rod, a straight vitreous substrate tube (comprised of quartz, for example) is,coated on its inside cylindrical surface with layers of doped silica (e.g. germaniumdoped silica). This can be achieved by positioning the substrate tube along the cylindrical axis of the resonant cavity, and flushing the inside of the tube with a gaseous mixture comprising $O_2$, $Si Cl_4$ and $GeCl_2$ (for example); a localized plasma is concurrently generated within the cavity, causing the reaction of Si, O and Ge so as to produce direct deposition of Ge-doped $SiO_x$, on the inside surface of the substrate tube. Since such deposition only occurs in the vicinity of the localized plasma, the resonant cavity (and thus the plasma) must be swept along the cylindrical axis of the tube in order to uniformly coat its whole length. When coating is completed, the tube is thermally collapsed into a rod having a Ge-doped silica core portion and a surrounding undoped silica cladding portion. Typically, such a rod is of the order of about 1 m long and 2 cm wide. If an extremity of the rod is heated so that it becomes molten, a thin glass fiber (typically of the order of about 125 $\mu$m wide) can be drawn from the rod and wound on a reel; this fiber then has a core and cladding portion corresponding to those of the rod. Because the Ge-doped core has a higher refractive index than the undoped cladding, the fiber can act as a waveguide, e.g. for use in propagating optical telecommunications signals. It should be noted that the gaseous mixture flushed through the substrate tube may also contain other components; e.g. the addition of $C_2F_6$ causes a reduction in the refractive index of the doped silica. It should also be noted that the preform rod may be placed in a so-called jacket tube (comprised of undoped silica) prior to the drawing procedure, so as to increase the quantity of undoped silica relative to doped silica in the final fiber.

The use of such a fiber for telecommunications purposes requires the fiber to be substantially free of flaws (e.g. discrepancies in dopant concentration, unwanted cross-section ellipticity, etc.) since, when considered over great lengths of the fiber, such flaws can cause serious attenuation of the carried signal. As a result, it is important that the PCVD process be highly uniform, since the quality of the deposited PCVD layers will ultimately determine the quality of the fiber; accordingly, it is important that the plasma generated in the resonant cavity be highly rotationally symmetric (about the cavity's cylindrical axis). On the other hand, the economy of the production process would be greatly improved if the preform rod could be made thicker, since greater lengths of fiber could then be obtained from a single rod. However, these two goals are difficult to unify, since increasing the diameter of the resonant cavity so as to allow use of a thicker substrate tube generally leads to a plasma with deteriorated rotational symmetry; moreover, such a plasma can only be generated at the expense of a much higher microwave power.

It is an object of the invention to alleviate this dilemma. More specifically, it is an object of the invention to provide a PCVD apparatus with which a plasma having improved rotational symmetry can be generated. In particular, it is an object of the invention that such an apparatus should be compatible with relatively wide substrate tubes. Moreover, it is an object of the invention that the new apparatus should have a relatively low microwave power consumption.

These and other objects are achieved according to the invention in an apparatus as specified in the opening paragraph, characterized in that:
  the cavity is substantially annular in form, with an inner cylindrical wall and an outer cylindrical wall;
  the inner cylindrical wall comprises a slit which extends in a full circle around the cylindrical axis;
  the guide has a longitudinal axis which is substantially perpendicular to the cylindrical axis and which does not intercept the slit.

The apparatus according to the invention exploits a number of insights, which combine to give exceptional results. First, since the cavity is annular instead of just an open-ended cylinder, it is essentially closed, which allows a more efficient standing wave generation; the slit in the inner wall of the annular cavity is then the only means by which a plasma can be generated by such standing waves, via a leakage field. Second, since the longitudinal axis of the microwave guide does not intercept the slit, the microwave energy carried by the guide cannot directly enter the plasma, resulting in more controlled and efficient mode excitation in the cavity. The combination of these factors produces inter alia the following advantageous effects when the apparatus according to the invention is employed to deposit silica on the inside surface of a tube:

1) the coupling of microwave energy into the plasma is observed to be less dependent on various "load" factors such as the flow rate, composition and pressure of the gaseous mixture which is flushed through the tube (and in which the plasma is generated);
2) the generated plasma appears to be more "intense", in that Si., O. and SiO. radicals are generated in greater profusion than in prior-art apparatus;
3) for a given microwave power level and "load" (see (1)), the number of radicals which reach the internal wall of the tube is higher than in prior-art apparatus.

As a result, a substantially greater silica deposition rate can be achieved at a given microwave power level. In addition, the efficiency with which $GeO_2$ dopant can be incorporated into the deposited silica is significantly increased. Combined with the fact that the rotational symmetry of the generated plasma is significantly better than in the prior art, even for larger-than-normal tube diameters, these aspects of the invention immediately illustrate the technical and economic advantages of the new apparatus.

It should be noted that the term "microwave guide" is here intended to have a broad scope, and should be interpreted as referring to any means for efficiently transferring microwave energy from a generation device (e.g. a klystron) to the resonant cavity. More specifically, the term encompasses means such as an antenna, coaxial guide, waveguids, etc.

A specific embodiment of the apparatus according to the invention is characterized in that the longitudinal axis of the guide does not bisect the resonant cavity, i.e. the "mouth" of the guide is not located symmetrically (viz. half way) with respect to the extremities of the cavity along its cylindrical axis. As a result of this measure, the coupling of microwave energy into the generated plasma is made even less dependent on the "load".

A further embodiment of the apparatus according to the invention is characterized in that the length of the resonant cavity parallel to its cylindrical axis is less than $\lambda/2$, in which $\lambda$ is the vacuum-wavelength of the microwave radiation delivered by the guide. This measure makes allowance for the capacitive coupling which the slit creates between the resonant cavity and the plasma, and generally helps to promote resonance at the desired frequency.

Another embodiment of the apparatus according to the invention is characterized in that the width W of the slit and the length L of the resonant cavity, both measured in a direction parallel to the cylindrical axis, satisfy the relationship: $W \leq L/10$. Such a relatively narrow slit advantageously leads to an increased electric field strength in the generated plasma.

A particular embodiment of the apparatus according to the invention is characterized in that a choke is situated outside each open end of the cavity and adjacent thereto. The term "choke" is elucidated, for example, by A. C. Metaxas and R. J. Meredith in *Industrial Microwave Heating*, Peter Peregrinus Ltd. (London), 1983, ISBN 0 906048 89 3: see, in particular, pp. 336 and 286–7. Use of chokes (e.g. $\lambda/4$-waveguides) in this manner at the extremities of the resonant cavity has a number of advantages, including:

better confinement (localization) of the generated plasma in a direction parallel to the cylindrical axis;

reduced escape of microwave radiation into the exterior environment of the cavity, thereby reducing the possible health risk to operating personnel.

A further embodiment of the apparatus according to the invention is characterized in that, in the region where the guide emerges into the resonant cavity, the guide is terminated by a body of material which is transparent to the microwaves delivered by the guide. The presence of such a terminating body of low-loss, non-ionizable material prevents the occurence of sparks between the guide and the cavity walls. Examples of such a material include boron nitride, polytetrafluoroethane.(PTFE), various ceramics, and vacuum (maintained in an evacuated glass chamber, for example).

The invention further relates to a method of manufacturing an optical fiber, comprising the successive steps of:

using PCVD to deposit layers of doped silica on the inside surface of a cylindrical vitreous substrate tube;

thermally collapsing the substrate tube so as to form a preform rod;

causing an extremity of the rod to become molten, and drawing an optical fiber therefrom.

According to the invention, this method is characterized in that the PCVD is performed in an apparatus according to the invention (and as claimed in any of the claims 1–6), whereby the substrate tube is located along the cylindrical axis and within the inner wall of the resonant cavity, the tube and cavity being substantially coaxial, and the resonant cavity is caused to move back and forth along (at least a portion of) the length of the substrate tube. Such use of the PCVD apparatus according to the invention allows the preform rod to be manufactured more quickly and economically, and also results in a preform rod whose doping cross section exhibits a greater rotational symmetry; the resulting optical fiber thus demonstrates reduced signal attenuation.

As already discussed above, the preform rod may be mounted in a silica jacket tube before the optical fiber is drawn, and such an additional step should be interpreted as falling within the scope of the method set forth in the previous paragraph and claimed in claim 7.

The invention also relates to a method of manufacturing a jacket tube for an optical fiber preform. A jacket tube is a cylindrical tube of (undoped) silica which can be placed over a preform rod in such a manner that the rod and tube are coaxial. A common extremity of the rod and jacket tube are then fused together, the fiber is drawn from this fused end, and the rest of the rod and tube gradually fuse together as the drawing process continues. Because it is located outside the undoped cladding Abortion of the preform rod, the jacket tube does not-have to be of a high optical quality; the use of a jacket tube in this manner is thus simply a cheap way of adding extra silica to the outside of the preform rod (thus thickening the final preform, and allowing a longer fiber of a given diameter to be drawn therefrom). Conventionally, jacket tubes are is made by employing Outside Vapor Deposition (OVD) to deposit a silica soot on a substrate mandrel; this is then followed by a drying, sintering and machining procedure, resulting in a tube with a diameter of the order of about 4–5 cm and a wall thickness of the order of about 1 cm. This diameter is significantly greater than that of a substrate tube (typically of the order of about 3 cm).

According to the invention, an alternative method of manufacturing a jacket tube for an optical fiber preform is characterized in that use is made of PCVD to deposit layers of undoped silica on the inside surface of a cylindrical vitreous sleeve, the PCVD being performed in an apparatus according to the invention (and as claimed in any of the claims 1–6), whereby the sleeve is located along the cylindrical axis and within the inner wall of the resonant cavity, the sleeve and cavity being substantially coaxial, and the resonant cavity is caused to move back and forth along (at least a portion of) the length of the sleeve. The finished product (sleeve+deposited silica) represents the required jacket tube.

Use of the invention in the manufacture of a jacket tube in this way represents a significant departure from the norm. Because a jacket tube is necessarily relatively wide, the employed vitreous sleeve (which acts as a substrate) must also have a relatively large diameter, and the resonant cavity must accordingly be wide enough to surround it. However, this also results in a wide plasma, with the attendant risk of poor rotational symmetry in its outer reaches. Nevertheless, as has already been explained, the PCVD apparatus according to the invention achieves improved rotational symmetry in the generated plasma, even at increased diameters. In addition, the apparatus according to the invention achieves more efficient and rapid deposition of silica at relatively low microwave powers, so that deposition of large quantities of silica on the inside of the sleeve (so as to achieve the required jacket tube thickness) can occur economically. Moreover, unlike the prior art, the method according to the invention is a one-step process which does not require a drying, sintering or machining procedure.

It should be explicitly noted that, where-reference is made to motion of the resonant cavity along the length of the substrate tube or vitreous sleeve, it is the intention to refer to relative motion, i.e. in practice, either the cavity or the substrate may be moved, as long as there is relative motion of the two (along their mutual cylindrical axis).

The invention and its attendant advantages will be further elucidated using an exemplary embodiment and the accompanying schematic drawing, whereby the Figure renders a cross-sectional view of part of a PCVD apparatus according to the invention.

EXEMPLARY EMBODIMENT

The FIGURE renders a cross-sectional view of part of a PCVD apparatus 1 according to the invention. The apparatus 1 comprises an elongated microwave guide 3 connecting a klystron (not depicted) to a resonant cavity 5 which is cylindrically symmetric about a cylindrical axis 7. The cavity 5 is substantially annular in form, with an inner cylindrical wall 9 and an outer cylindrical wall 11. The inner cylindrical wall 9 comprises a slit 13 which extends in a full circle around the cylindrical axis 7 (in a plane perpendicular to the plane of the FIG.). The guide 3 has a (central) longitudinal axis 15 which is substantially perpendicular to the cylindrical axis 7. The longitudinal axis 15 and slit 13 are offset with respect to one another in such a way that the axis 15 does not intercept the slit 13.

The cavity 5 has a length L parallel to the cylindrical axis 7, whereas the width of the slit 13 (measured in the same direction) is W. As here depicted, the longitudinal axis 15 of the guide 3 is offset to one side so that it does not bisect the cavity 5, i.e. the distance between the axis 15 and either extremity 19, 21 of the cavity 5—measured parallel to the axis 7—is not L/2.

As here depicted, the guide 3 is terminated by a microwave-transparant body 17 in the region where the guide 3 emerges into the cavity 5; this body 17 may, for example, take the form of a TEFLON "plug". In further preferential embodiments, $L<\lambda/2$ (in which $\lambda$ is the vacuum-wavelength of the microwave radiation delivered to the cavity 5 by the guide 3) and $W \leq L/10$.

In an advantageous embodiment of the apparatus 1, a choke (not depicted) is positioned near each extremity 19, 21 of the cavity 5. Each such choke may take the form of an annular $\lambda/4$-waveguide which is centered on the cylindrical axis 7 and is positioned so as to be in close proximity to (e.g. within a few millimeters of) the relevant extremity 19, 21.

An open-ended cylindrical hollow 4 of diameter D exists within the inner wall 9 of the cavity 5, and extends along the cylindrical axis 7. A substrate tube (not depicted) can be positioned within, and slid along, this hollow 4.

In use, a gaseous mixture can be flushed along the hollow 4 and the apparatus 1 can be used to generate a plasma (not depicted) within a portion of the hollow 4, as further elucidated above in the Description of the Invention.

What is claimed is:

1. A method of manufacturing an optical fiber by using an apparatus comprising an elongated microwave guide coupled to a resonant cavity substantially cylindrically symmetric about a cylindrical axis, the resonant cavity having a length, L, parallel to the cylindrical axis, an inner wall, and an outer cylindrical wall, the inner cylindrical wall comprising a slit having a width, W, and extending in a fall circle around the cylindrical axis, and the guide having a longitudinal axis which is substantially perpendicular to the cylindrical axis and which does not intercept the slit, the elongated microwave guide configured to deliver microwave radiation energy to the resonant cavity, the width, W, of the slit and the length, L, of the resonant cavity both measured in a direction parallel to the cylindrical axis to satisfy the relationship: $W \leq L/10$, the method comprising:

locating a substrate tube along the cylindrical axis and within the inner wall of the resonant cavity, the substrate tube having an inner surface and a length, the substrate tube and resonant cavity being substantially coaxial, and the resonant cavity being caused to move back and forth along the length of the substrate tube;

using Plasma Chemical Vapor Deposition to deposit layers of doped silica on the inside surface of the substrate tube;

thermally collapsing the substrate tube so as to form a preform rod;

causing an extremity of the preform rod to become molten; and drawing an optical fiber from the preform rod.

2. The method of claim 1 wherein the substrate tube is vitreous.

3. The method of claim 2 wherein the substrate tube is cylindrical.

4. The method of claim 1, wherein locating the substrate tube, using Plasma Chemical Vapor Deposition, thermally collapsing the substrate tube, causing an extremity of the preform rod to become molten, and drawing an optical fiber from the preform rod are performed in succession.

5. The method of claim 1 wherein the longitudinal axis does not bisect the resonant cavity.

6. The method of claim 1 wherein the length, L, of the resonant cavity is less than $\lambda/2$.

7. The method of claim 1, wherein the resonant cavity includes one or more open ends and further comprises situating a choke outside each open end of the cavity and adjacent thereto.

8. The method of claim 1 wherein the elongated microwave guide emerges into the resonant cavity, the elongated microwave guide being terminated by a body of material that is transparent to microwave radiation delivered by the elongated microwave guide.

9. A method of manufacturing an optical fiber preform rod by using an apparatus comprising an elongated microwave guide coupled to a resonant cavity substantially cylindrically symmetric about a cylindrical axis, the resonant cavity having a length, L, parallel to the cylindrical axis, an inner wall, and an outer cylindrical wall, the inner cylindrical wall comprising a slit having a width, W, and extending in a full circle around the cylindrical axis, and the guide having a longitudinal axis which is substantially perpendicular to the cylindrical axis and which does not intercept the slit, the elongated microwave guide configured to deliver microwave radiation energy to the resonant cavity, the width, W, of the slit and the length, L, of the resonant cavity both measured in a direction parallel to the cylindrical axis to satisfy the relationship: $W \leq L/10$, the method comprising the successive steps of:

locating a cylindrical vitreous substrate tube along the cylindrical axis and within the inner wall of the resonant cavity, the cylindrical vitreous substrate tube having an inner surface and a length, the cylindrical vitreous substrate tube and resonant cavity being substantially coaxial, and the resonant cavity being caused to move back and forth along the length of the cylindrical vitreous substrate tube;

using Plasma Chemical Vapor Deposition to deposit layers of doped silica on the inside surface of a cylindrical vitreous substrate tube; and thermally collapsing the cylindrical vitreous substrate tube so as to form the preform rod.

10. The method of claim 9 wherein the substrate tube is vitreous.

11. The method of claim 9 wherein the substrate tube is cylindrical.

12. The method of claim 9, wherein locating the substrate tube, using Plasma Chemical Vapor Deposition and thermally collapsing the substrate tube are performed in succession.

13. A method of manufacturing a jacket tube for an optical fiber preform by using an apparatus comprising an elongated microwave guide coupled to a resonant cavity substantially cylindrically symmetric about a cylindrical axis, the resonant cavity having a length, L, parallel to the cylindrical axis, an inner wall, and an outer cylindrical wall, the inner cylindrical wall comprising a slit having a width, W, and extending in a full circle around the cylindrical axis, and the guide having a longitudinal axis which is substantially perpendicular to the cylindrical axis and which does not intercept the slit, the elongated microwave guide configured to deliver microwave radiation energy to the resonant cavity, the width, W, of the slit and the length, L, of the resonant cavity both measured in a direction parallel to the cylindrical axis to satisfy the relationship: $W \leq L/10$, the method comprising the successive steps of:

locating a cylindrical vitreous sleeve along the cylindrical axis and within the inner wall of the resonant cavity, the cylindrical vitreous sleeve having an inner surface and a length, the cylindrical vitreous sleeve and resonant cavity being substantially coaxial, and the resonant cavity being caused to move back and forth along the length of the cylindrical vitreous sleeve; and using Plasma Chemical Vapor Deposition to deposit layers of undoped silica on the inside surface of the cylindrical vitreous sleeve.

14. The method of claim 13 wherein the longitudinal axis does not bisect the resonant cavity.

15. The method of claim 13 wherein the length, L, of the resonant cavity is less than $\lambda/2$.

16. The method of claim 13, wherein the resonant cavity includes one or more open ends and further comprises situating a choke outside each open end of the cavity and adjacent thereto.

17. The method of claim 13 wherein the elongated microwave guide emerges into the resonant cavity, the elongated microwave guide being terminated by a body of material that is transparent to microwave radiation delivered by the elongated microwave guide.

* * * * *

UNITED STATES PATENT AND TRADEMARK OFFICE
CERTIFICATE OF CORRECTION

PATENT NO.  : 6,372,305 B2
DATED       : April 16, 2002
INVENTOR(S) : Antonius Henricus Elisabeth Breuls et al.

It is certified that error appears in the above-identified patent and that said Letters Patent is hereby corrected as shown below:

<u>Column 5,</u>
Line 64, "extending in a fall circle" should be corrected to read -- extending in a full circle --.

Signed and Sealed this

Twenty-third Day of July, 2002

Attest:

Attesting Officer

JAMES E. ROGAN
*Director of the United States Patent and Trademark Office*